United States Patent
Pinto et al.

(10) Patent No.: US 11,800,684 B2
(45) Date of Patent: Oct. 24, 2023

(54) HEAT PIPE WITH MULTIPLE STAGES OF COOLING

(71) Applicant: GM Global Technology Operations LLC, Detroit, MI (US)

(72) Inventors: Nicholas W. Pinto, Shelby Township, MI (US); Chih-hung Yen, Bloomfield Hills, MI (US); Nathan Thompson, Sterling Heights, MI (US); Anne M. Dailly, West Bloomfield, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 410 days.

(21) Appl. No.: 17/152,178

(22) Filed: Jan. 19, 2021

(65) Prior Publication Data
US 2022/0232735 A1    Jul. 21, 2022

(51) Int. Cl.
*H05K 7/20* (2006.01)
*F28D 15/04* (2006.01)
*G08B 21/18* (2006.01)

(52) U.S. Cl.
CPC ......... *H05K 7/20336* (2013.01); *F28D 15/04* (2013.01); *F28D 15/046* (2013.01); *G08B 21/182* (2013.01); *H05K 7/20136* (2013.01); *H05K 7/20381* (2013.01)

(58) Field of Classification Search
CPC ..... F28D 15/04; F28D 15/046; G08B 21/182; H05K 7/20136; H05K 7/20336; H05K 7/20381
See application file for complete search history.

(56) References Cited

U.S. PATENT DOCUMENTS

| | | | | |
|---|---|---|---|---|
| 5,217,063 A | * | 6/1993 | Scaringe | F28D 15/06 165/104.27 |
| 5,412,535 A | * | 5/1995 | Chao | F28D 15/06 29/890.032 |
| 8,235,096 B1 | * | 8/2012 | Mahefkey | H05K 7/20336 165/104.33 |
| 2007/0240852 A1 | * | 10/2007 | Liu | F28D 15/0275 165/104.14 |
| 2009/0020269 A1 | * | 1/2009 | Chang | F28D 15/046 165/104.26 |
| 2012/0227935 A1 | * | 9/2012 | Huang | B21D 41/04 29/890.032 |

(Continued)

*Primary Examiner* — Eric S Ruppert
*Assistant Examiner* — Hans R Weiland
(74) *Attorney, Agent, or Firm* — Vivacqua Crane PLLC (57) ABSTRACT

A heat pipe is provided for cooling an electronic component of a printed circuit board. The heat pipe includes a tube having an inner diameter surface defining a bore, with the tube having first and second ends along the bore. The heat pipe further includes a sorbent material coated onto the inner diameter surface of the tube, a first liquid contained within the bore, and a second liquid adsorbed by the sorbent material. The second liquid has a second boiling temperature that is higher than a first boiling temperature of the first liquid. The first liquid vaporizes into a first vapor, in response to the tube receiving heat from the electronic component and the first liquid reaching the first boiling temperature. The second liquid is desorbed from the sorbent material and vaporizes into a second vapor in response to the second liquid reaching the second boiling temperature.

18 Claims, 6 Drawing Sheets

(56) References Cited

U.S. PATENT DOCUMENTS

2016/0131435 A1* 5/2016 Lee .................... F28D 15/0233
165/104.21
2018/0080718 A1* 3/2018 Li ........................ F28D 15/046
2021/0372709 A1* 12/2021 Bandyopadhyay ..... F28D 15/04

* cited by examiner

HEAT PIPE WITH MULTIPLE STAGES OF COOLING

INTRODUCTION

The present disclosure generally relates to electronics cooling, and more particularly relates to a heat pipe with multiple liquids and associated boiling temperatures that are different from one another to provide multiple stages of cooling.

Electronics generate heat whenever an electric current flows through them. The amount of heat depends on the power, device characteristics, and circuit design. The resistance of processors, driver circuits, power circuits, and memory contribute to some heat and power losses. To avoid failures or circuit malfunctions, electronics must operate and remain within safe temperature limits. While some circuits will work without additional cooling, there are other circuits that include mechanisms for dissipating heat.

Existing heat pipes for electronics include an elongated tube containing a single liquid. The tube has a first end that transfers heat from an electronic component to the liquid, such that the liquid vaporizes into a vapor when the temperature of the liquid reaches its boiling temperature. The heat pipe further includes a second end that transfers heat from the vapor to the surrounding environment for condensing the vapor into the liquid when the temperature of the vapor falls below the boiling temperature. The heat pipe further includes a wick material interconnecting the first and second ends to return the condensed liquid from the second end to the first end. In a dry-out condition when the entire liquid vaporizes into a vapor, the vapor does not move toward the second end to cool and condensate does not form and return to the first end, such that the ability of the heat pipe to cool is adversely affected.

Thus, while existing heat pipes achieve their intended purpose, there is a need for a new and improved heat pipe for electronics that addresses these issues.

SUMMARY

According to several aspects of the present disclosure, a heat pipe is provided for cooling an electronic component of a printed circuit board. The heat pipe includes a tube having an inner diameter surface that defines a bore, with the tube having first and second ends along the bore. The heat pipe further includes a sorbent material coated onto the inner diameter surface of the tube. The heat pipe further includes a first liquid, which is contained within the bore of the tube and has a first boiling temperature. The heat pipe further includes a second liquid, which is adsorbed by the sorbent material and has a second boiling temperature that is higher than the first boiling temperature of the first liquid. The first liquid vaporizes into a first vapor, in response to the tube receiving heat from the electronic component and the first liquid reaching the first boiling temperature. The first vapor flows toward the second end of the tube where the first vapor dissipates heat through the tube and condenses into the first liquid. The second liquid is desorbed from the sorbent material, in response to the second liquid and the sorbent material reaching a predetermined desorption temperature that is less than the second boiling temperature. The second liquid vaporizes into a second vapor, in response to the second liquid reaching the second boiling temperature.

In one aspect, the sorbent material is configured to desorb at least a portion of the second liquid into the bore before all of the first liquid vaporizes into the first vapor.

In another aspect, the inner diameter surface defines at least one axial groove extending between the first and second ends for drawing the first liquid by capillary action from the second end to the first end.

In another aspect, a plurality of axial grooves are spaced circumferentially from one another on the inner diameter surface.

In another aspect, the sorbent material is spaced from the second end of the tube, such that the condensed first liquid flows from the bore to the axial grooves. The sorbent material is further spaced from the first end of the tube, such that the first liquid returns from the axial grooves to the bore.

In another aspect, the first liquid is water.

In another aspect, the second liquid is ethylene glycol.

According to several aspects of the present disclosure, an electronics cooling system includes an electronic component that generates heat. The electronics cooling system further includes a heat pipe for cooling the electronic component, and the heat pipe includes a tube having an inner diameter surface that defines a bore. The tube has first and second ends along the bore. The heat pipe further includes a sorbent material coated onto the inner diameter surface of the tube proximal to the first end. The heat pipe further includes a first liquid, which is contained within the bore of the tube and has a first boiling temperature. The heat pipe further includes a second liquid, which is adsorbed by the sorbent material and has a second boiling temperature. The second boiling temperature of the second liquid is higher than the first boiling temperature of the first liquid. The first liquid vaporizes into a first vapor, in response to the first end of the tube receiving heat from the electronic component and the first liquid reaching the first boiling temperature. The first vapor moves toward the second end where the first vapor dissipates heat through the tube and condenses into the first liquid. The second liquid is desorbed from the sorbent material, in response to the second liquid and the sorbent material reaching a predetermined desorption temperature that is less than the second boiling temperature. The second liquid vaporizes into a second vapor, in response to the second liquid reaching the second boiling temperature. The electronics cooling system further includes one or more thermocouples attached to at least one of the electronic component and the heat pipe for generating a first temperature signal associated with a temperature of the first liquid. The electronics cooling system further includes a controller electrically connected to the thermocouple. The controller compares the temperature of the first liquid to a first temperature threshold, in response to the controller receiving the first temperature signal from the thermocouple. The controller generates a first warning notification signal, in response to the controller determining that the temperature of the first liquid is above the first temperature threshold. The controller is electrically coupled to a display device for displaying a first warning indicative of the first liquid approaching the first temperature threshold, in response to the display device receiving the first warning notification signal from the controller.

In one aspect, the thermocouple generates a second temperature signal associated with the temperature of the second liquid. The controller compares the temperature of the second liquid to a second temperature threshold, in response to the controller receiving the second temperature signal from the thermocouple. The controller generates a second warning notification signal, in response to the controller determining that the temperature of the second liquid is above the second temperature threshold. The display device displays a second warning indicative of the temperature of the second liquid approaching the second temperature threshold, in response to the display device receiving the second warning notification signal from the controller.

In another aspect, the electronics cooling system further includes a fan that generates a flow of air for cooling the second end of the tube and the first vapor within the tube.

In another aspect, the electronics cooling system further includes a wick material attached to the inner diameter surface adjacent to the second end of the tube, with the wick material being different from the sorbent material.

In another aspect, the wick material is a layer extending from the second end to a portion of the tube that is adjacent to the electronic component.

In another aspect, the sorbent material includes a plurality of recesses and the wick material further includes a plurality of protrusions extending from the layer into the recesses of the sorbent material, such that the wick material draws the first liquid from the second end to the first end of the tube.

In another aspect, the inner diameter surface defines a plurality of axial grooves extending between the first and second ends for drawing the first liquid by capillary action from the second end to the first end. The axial grooves are spaced circumferentially from one another about the inner diameter surface.

In another aspect, the sorbent material is spaced from the second end of the tube, such that the condensed first liquid flows from the bore to the axial grooves. The sorbent material is further spaced from the first end of the tube, such that the first liquid returns from the axial grooves to the bore.

In another aspect, the thermocouples include a first thermocouple, which is attached to the electronic component and generates the first temperature signal. The thermocouples further include a second thermocouple, which is attached to the heat pipe and generates the second temperature signal.

According to several aspects of the present disclosure, a method of operating an electronics cooling system is provided. The electronics cooling system includes an electronic component and a heat pipe attached to the electronic component. The heat pipe includes a tube having an inner diameter surface defining a bore, a sorbent material coated onto the inner diameter surface, a first liquid contained within the bore, a second liquid adsorbed by the sorbent material, one or more thermocouples attached to at least one of the electronic component and the heat pipe, and a controller. The method includes the step of transferring heat from the electronic component to the first liquid at a first end of the closed ended tube. The first liquid vaporizes into a first vapor, in response to the first liquid receiving heat from the electronic component and the first liquid reaching the first boiling temperature. The first vapor flows from a first end of the closed ended tube to a second end of the closed ended tube where the first vapor dissipates heat through the tube. The first vapor condenses into the first liquid, in response to the first vapor dissipating heat through the tube. The second liquid is desorbed from the sorbent material, in response to the second liquid and the sorbent material reaching a predetermined desorption temperature that is less than the second boiling temperature. The second liquid vaporizes into a second vapor, in response to the second liquid reaching the second boiling temperature.

In one aspect, at least a portion of the second liquid is desorbed from the sorbent material and disposed in the bore prior to all of the first liquid vaporizing into the first vapor.

In another aspect, the first liquid is drawn by capillary action from the second end to the first end and through at least one axial groove formed in the inner diameter surface.

In another aspect, the thermocouple generates a first temperature signal associated with a temperature of the first liquid. The controller compares the temperature of the first liquid to a first temperature threshold, in response to the controller receiving the first temperature signal from the thermocouple. The controller generates a first warning notification signal, in response to the controller determining that the temperature of the first liquid is above the first temperature threshold. A display device displays a first warning indicative of the first liquid approaching the first temperature threshold, in response to the display device receiving the first warning notification signal from the controller. The thermocouple generates a second temperature signal associated with a temperature of the second liquid. The controller compares the temperature of the second liquid to a second temperature threshold, in response to the controller receiving the second temperature signal from the thermocouple. The controller generates a second warning notification signal, in response to the controller determining that the temperature of the second liquid is above the second temperature threshold. The display device displays a second warning indicative of the temperature of the second liquid approaching the second temperature threshold, in response to the display device receiving the second warning notification signal from the controller.

Further areas of applicability will become apparent from the description provided herein. It should be understood that the description and specific examples are intended for purposes of illustration only and are not intended to limit the scope of the present disclosure.

DETAILED DESCRIPTION

The following description is merely exemplary in nature and is not intended to limit the present disclosure, application, or uses.

An exemplary electronics cooling system includes a heat pipe having a sorbent material to separate and recombine two or more liquids for cooling one or more electronic components. As described in the detailed examples below, the heat pipe includes two liquids having two different boiling temperatures with one liquid stored in a bore of a heat pipe and another liquid stored in a sorbent material. These two liquids provide a dual active thermal region (or a range of working temperatures) within which the heat pipe removes heat from the electronic component. The range of working temperatures can be extend from the lowest freezing point of the two liquids to the highest boiling point of the two liquids. Within this range, the liquids receive heat from the electronic component, which in turn increases the temperature of the liquids. One skilled in the art will understand that heat can be transferred by removing the heat from a heat source and flowing the heat to another substance, such as a liquid with or without causing the liquid to reach its boiling temperature. As but one example, the working temperature of a heat pipe with only water is from 32 degrees Fahrenheit (the freezing point) to 212 degrees Fahrenheit (the boiling point at sea level). Evaporation is vaporization on the water/air surface, and evaporation can happen at any temperature between the freezing point and the boiling point under 1 atmosphere of pressure while keeping the heat pipe functional. It is contemplated that the heat pipe can include more than two working liquids, and the sorbent material can be disposed in any position relative to the electronic components to tune the heat pipe for selecting the percentage of each liquid being used for cooling. Furthermore, the example of the system described in detail below is an open loop passive system with a gravity-fed closed-ended tube having a first closed end adjacent to the electronic component and a second closed end adjacent to a cooling fan. However, it is contemplated that other examples of the system can be a closed loop active system including a tube forming a loop and a pump pumping condensate through the loop to return to the electronic component. In addition, the examples of sorbent material described below are proximal to electronic components, it is contemplated that the sorbent material can be axially spaced from the electronic components and form a layer having any suitable thickness for providing an associated cooling characteristic. In still other examples, different sections of the sorbent material can initially store different liquids having associated boiling temperatures that are different from one another and are desorbed from the associated section of sorbent material at associated temperatures to remove heat from the electronic components.

Figure 1:
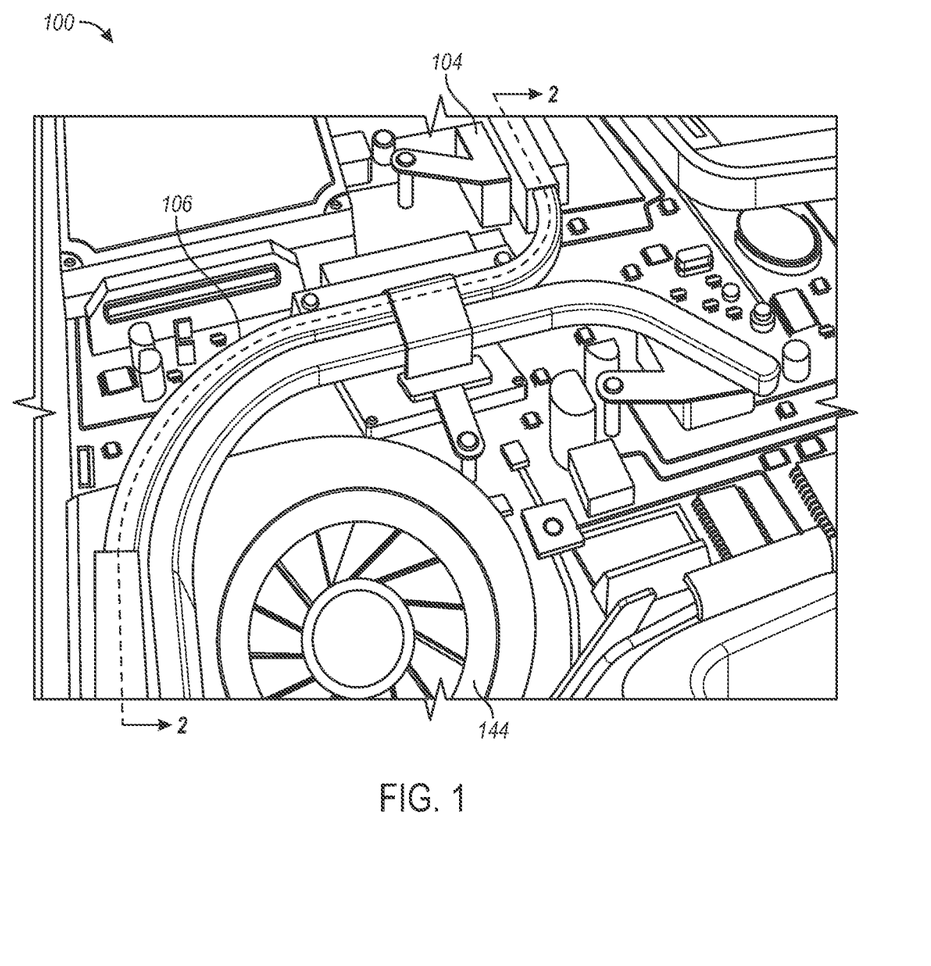
FIG. 1 is a perspective view of one example of an electronics cooling system having an electronic component and a heat pipe for cooling the electronic component.
Figure 2:
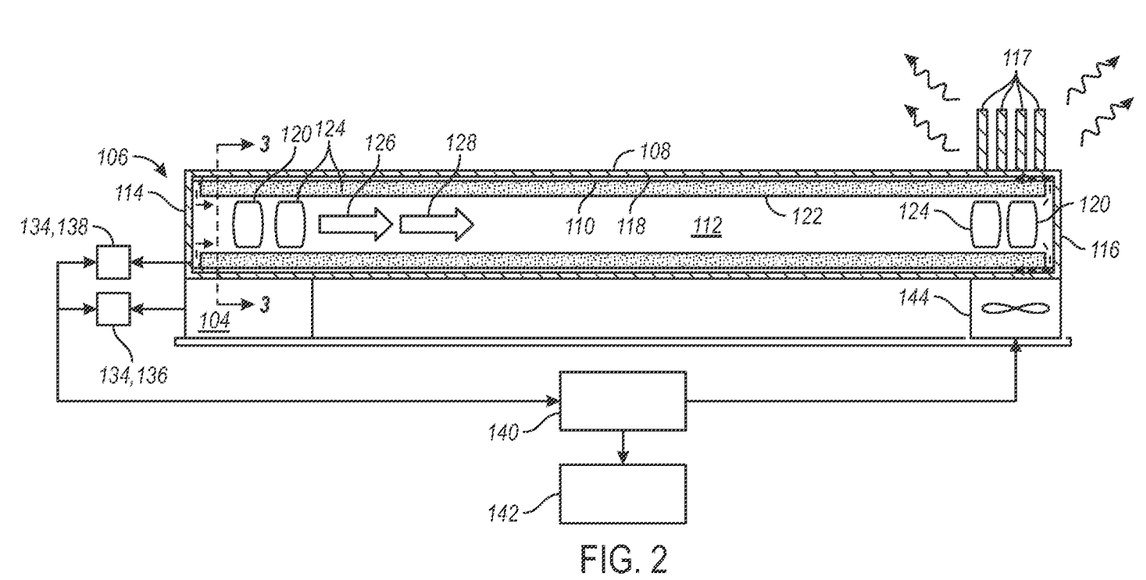
FIG. 2 is a cross-sectional view of one example of the heat pipe of FIG. 1, as taken along line 2-2.

Referring to FIGS. 1 and 2, one example of an electronics cooling system 100 includes an electronic component 104 that generates heat, in response to an electric current flowing through the electronic component 104. The electronic component can be a processor, driver circuits, power circuits, memory, or any other electronic component that generates in response to receiving an electric current.

Figure 3:
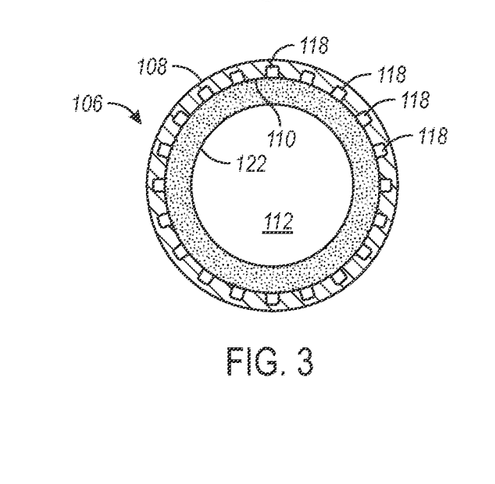
FIG. 3 is a cross-sectional view of the heat pipe of FIG. 2, as taken along line 3-3, illustrating the heat pipe having an inner diameter surface defining a plurality of axial grooves for drawing condensed first liquid from a second end of the heat pipe to a first end of the heat pipe.

As best shown in FIGS. 2 and 3, the system 100 further includes a heat pipe 106 for cooling the electronic component 104. The heat pipe 106 includes a tube 108 having an inner diameter surface 110 defining a bore 112, with the tube 108 having first and second ends 114, 116 (FIG. 2) along the bore 112. The inner diameter surface 110 defines one or more axial grooves 118 extending between the first and second ends 114, 116 for drawing a first liquid 120 by capillary action from the second end 116 to the first end 114 as described in detail below. As best shown in FIG. 3, the axial grooves 118 are spaced circumferentially by a uniform distance from one another about the inner diameter surface 110. It is contemplated that the grooves can be spaced circumferentially from one another by a variety of uniform or non-uniform distances about the inner diameter surface.

The heat pipe 106 further includes a sorbent material 122 coated onto the inner diameter surface 110 of the tube 108 and spaced from the first and second ends 114, 116 of the tube 108. Put another way, the sorbent material 122 is coated onto an entire length of the inner diameter surface 110 except for a portion immediately adjacent to the first end 114 and another portion immediately adjacent to the second end 116. The sorbent material 122 is configured to desorb at least a portion of a second liquid 124 into the bore 112 before all of the first liquid 120 vaporizes into a first vapor 126. It is contemplated that the sorbent material can be coated onto any portion of the inner diameter surface. The sorbent material is selected from the group consisting of a zeolite, a silica gel, and a metal organic framework. However, in other examples, the sorbent material can include other suitable materials for desorbing and adsorbing the second liquid.

The first liquid 120 is contained within the bore 112 of the tube 108 and has a first boiling temperature. The first liquid 120 vaporizes into a first vapor 126, in response to the tube 108 and the first liquid 120 receiving heat from the electronic component 104 and the first liquid 120 reaching the first boiling temperature. The first vapor 126 moves from the first end 114 to the second end 116 where the first vapor 126 dissipates heat through the tube 108 and condenses into the first liquid 120.

Figure 4:
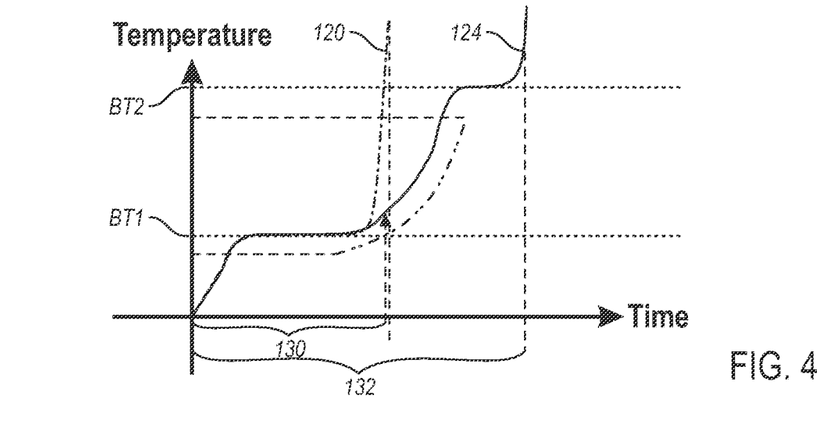
FIG. 4 is a chart illustrating multiple liquids in the heat pipe of FIG. 1 cooling the electronic component of the printed circuit board.

The heat pipe 106 further includes a second liquid 124 that is adsorbed by the sorbent material 122 and has a second boiling temperature that is higher than the first boiling temperature of the first liquid 120. The second liquid 124 is desorbed from the sorbent material 122 and vaporizes into a second vapor 128, in response to the second liquid 124 reaching the second boiling temperature. In this example, the first liquid 120 is water with a boiling temperature of 212 degrees Fahrenheit, and the second liquid 124 is ethylene glycol with a boiling temperature of 387 degrees Fahrenheit. However, it is contemplated that the first and second liquids can be other suitable liquids with associated boiling temperatures. As shown in FIG. 4, during a first stage 130 of cooling, the first liquid 120 receives heat, which causes the temperature of the first liquid 120 to increase to the first boiling temperature BT1 and vaporize. During a second stage 132 of cooling, the sorbent material 122 and the second liquid 124 receives heat from the electronic component 104 until the temperature of the sorbent material 122 and the second liquid 124 increases to a predetermined desorption temperature. The predetermined desorption temperature is lower than the second boiling temperature of the second liquid 124. More specifically, in this example, the predetermined desorption temperature is lower than both the first boiling temperature of the first liquid 120 and the second boiling temperature of the second liquid 124. Accordingly, before all of the first liquid 120 vaporizes, the second liquid 124 is released from the sorbent material 122, in response to the temperature of the sorbent material 122 and the second liquid 124 reaching the predetermined desorption temperature. The second liquid 124 vaporizes, in response to the temperature of the second liquid 124 reaching the second boiling temperature BT2.

In one example, the sorbent material 122 can release the second liquid 124 to combine with the first liquid 120, such that the boiling temperature of the resultant mixture can have a boiling temperature depending on the concentration of the mixture. Examples of the boiling temperature and concentration of ethylene glycol in water can include the values in the table below.

| Weight % Ethylene Glycol | Boiling Point of Solution (deg F.) | Boiling Point of Solution (deg C.) |
| --- | --- | --- |
| 0 | 212 | 100 |
| 10 | 215 | 102 |
| 20 | 215 | 102 |
| 30 | 220 | 104 |
| 40 | 220 | 104 |
| 50 | 225 | 107 |
| 60 | 230 | 110 |
| 70 | 240 | 116 |
| 80 | 255 | 124 |
| 90 | 285 | 140 |
| 100 | 387 | 197 |

The concentration or weight percentage of the solution can be controlled by at least one of: using predetermined liquids with associated boiling points, positioning sorbent materials holding those liquids at predetermined positions relative to the electronic components, and forming the sorbent material into layers of predetermined thicknesses.

Referring back to FIG. 2, the system 100 further includes one or more thermocouples 134 attached to at least one of the electronic component 104 and the heat pipe 106, with the thermocouple 134 generating a first temperature signal associated with a temperature of the first liquid and a second temperature signal associated with the temperature of the second liquid 124. More specifically, in this example, the at least one thermocouple 134 includes a first thermocouple 136 that is attached to the electronic component 104 and generates the first temperature signal. The at least one thermocouple 134 further includes a second thermocouple 138 that is attached to the heat pipe 106 and generates the second temperature signal. In other examples, the system includes a single thermocouple disposed within the bore of the tube or disposed in any other location and attached to any portion of the heat pipe or the electronic component.

The system 100 further includes a controller 140 electrically connected to the thermocouples 134. The controller 140 compares the temperature of the first liquid 120 to a first temperature threshold, in response to the controller 140 receiving the first temperature signal from the thermocouple 134. The controller 140 generates a first warning notification signal, in response to the controller 140 determining that the temperature of the first liquid 120 is above the first temperature threshold. In this example, the first temperature threshold is the first boiling temperature of the first liquid, such as 212 degrees Fahrenheit associated with water. The controller 148 compares the temperature of the second liquid 124 to a second temperature threshold, in response to the controller 140 receiving the second temperature signal from the thermocouple 134. The controller 140 generates a second warning notification signal, in response to the controller 140 determining that the temperature of the second liquid 124 is above the second temperature threshold. Continuing with the previous example, the second temperature threshold is the second boiling temperature of the second liquid 124, such as 387 degrees Fahrenheit associated with ethylene glycol.

The controller 140 is further electrically coupled to a display device 142 for displaying a first warning indicative of the first liquid 120 approaching the first temperature threshold, in response to the display device 142 receiving the first warning notification signal from the controller 140. The display device 142 further displays a second warning indicative of the temperature of the second liquid 124 approaching the second temperature threshold, in response to the display device 142 receiving the second warning notification signal from the controller 140.

The system 100 further includes a fan 144 that generates a flow of air over the second end 116 of the tube 108 and the fins 117 (FIG. 2) extending from the tube 108 to dissipate heat from the same.

Figure 5:
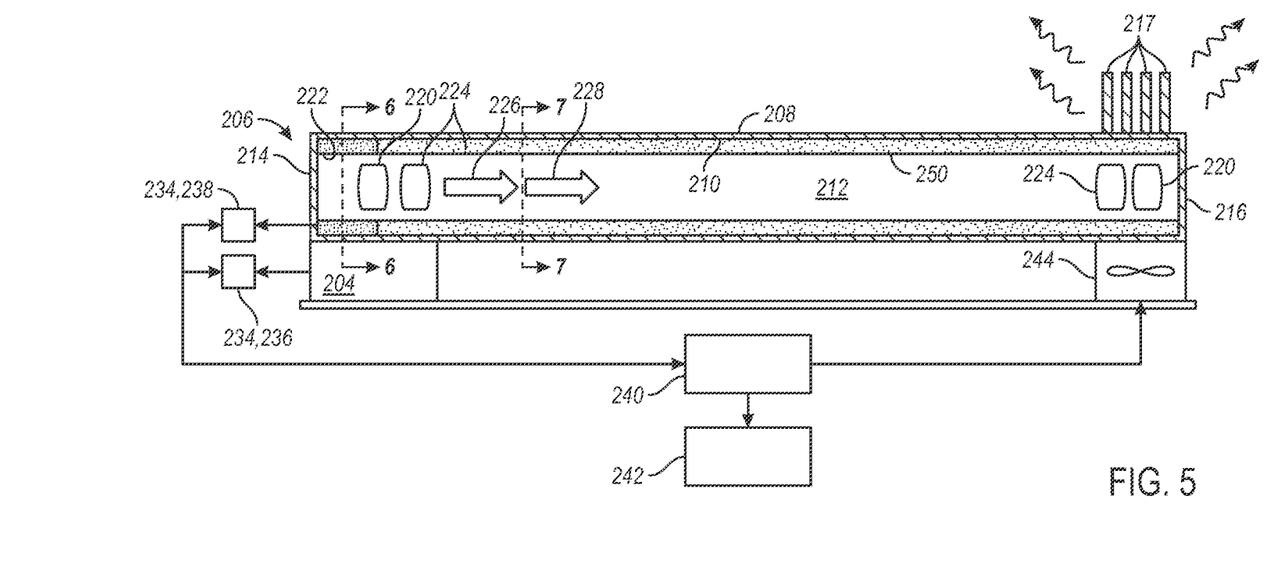
FIG. 5 is a cross-sectional view of another example of the heat pipe of FIG. 1, illustrating the heat pipe including wick material with the inner diameter surface being free of axial grooves.
Figure 6:
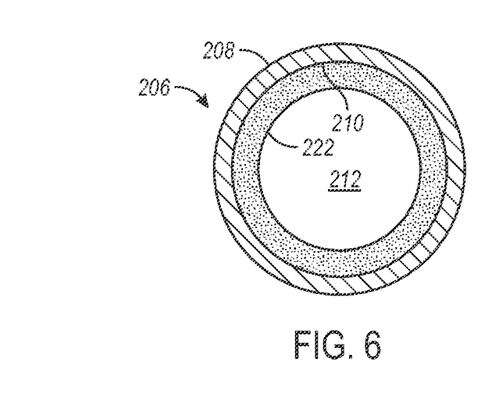
FIG. 6 is a cross-sectional view of the heat pipe of FIG. 5, as taken along line 6-6, illustrating the sorbent material coated onto the inner diameter surface.
Figure 7:
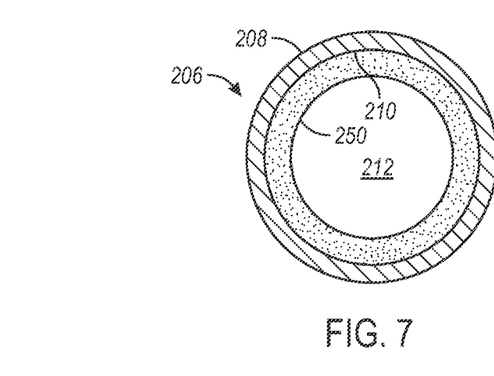
FIG. 7 is a cross-sectional view of the heat pipe of FIG. 5, as taken along line 7-7, illustrating the wick material coated onto the inner diameter surface.

Referring to FIGS. 5-7, another example of a heat pipe 206 is similar to the heat pipe 106 of FIG. 2 and includes the same components identified by the same reference numbers increased by 100. While the heat pipe 106 of FIGS. 2-3 has the axial grooves 118 for returning the first liquid 120 from the second end 116 to the first end 114. The heat pipe 206 includes an inner diameter surface 210 free of grooves. The heat pipe 206 includes a wick material 250 that is coated onto the inner diameter surface 210 and is different from the sorbent material 222. The wick material 250 extends from a portion of the inner diameter surface 210 adjacent to the second end 216 to a portion of the inner diameter surface 210 adjacent to the electronic component 204. The wick material 250 absorbs the first liquid 220 after the first vapor 226 travels from the first end 214 to the second end 216 where the first vapor 226 dissipates heat through the tube 208 and condenses into the first liquid 220, such that the wick material 250 draws the first liquid 220 from the second end 216 toward the first end 214. While the heat pipe 106 of FIG. 2 includes a tube 108 with sorbent material 122 extending from a portion proximal to the first end 114 to another portion proximal to the second end 116, the heat pipe 206 includes a sorbent material 222 coated onto only a portion immediately adjacent to the first end 214. The entire sorbent material 222 and a portion of the electronic component 204 are disposed co-extensive relative to one another along the tube 208, with another portion of the electronic component 204 extending axially beyond the sorbent material 222.

Figure 8:
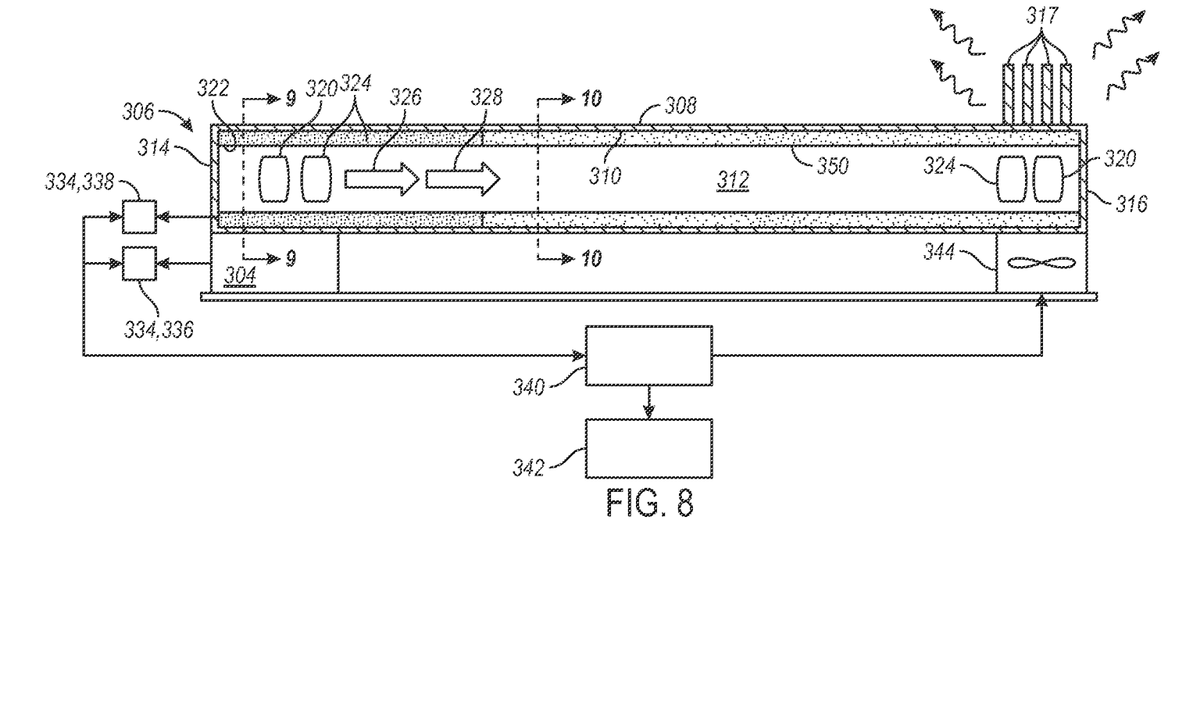
FIG. 8 is a cross-sectional view of yet another example of the heat pipe of FIG. 1.
Figure 9:
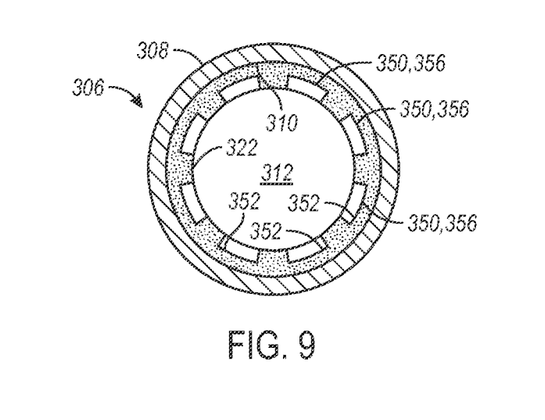
FIG. 9 is a cross-sectional view of the heat pipe of FIG. 8, as taken along line 9-9, illustrating the wick material coated having multiple protrusions extending from an integral layer of the wick material into associated recesses of the sorbent material.
Figure 10:
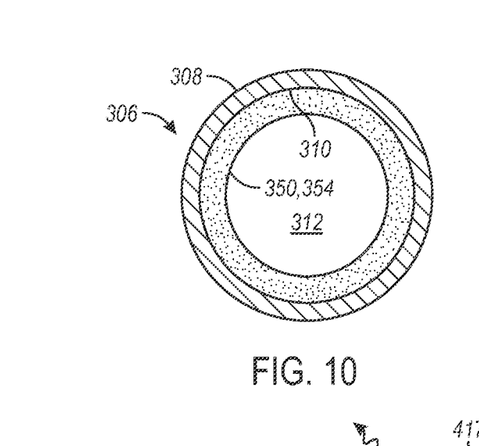
FIG. 10 is a cross-sectional view of the heat pipe of FIG. 8, as taken along line 10-10, illustrating the integral layer of the wick material.

Referring to FIGS. 8-10, another example of a heat pipe 306 is similar to the heat pipe 206 of FIGS. 5-7 and includes the same components identified by the same reference numbers increased by 100. While the entire sorbent material 222 and only a portion of the electronic component 204 of FIGS. 4-6 are disposed co-extensive relative to one another along the tube 208, the entire electronic component 304 and a portion of the sorbent material 322 are disposed co-extensive relative to one another along the tube 308, with another portion of the sorbent material 322 extending axially beyond the electronic component 304. As compared to the heat pipe 206 of FIGS. 5-7, the heat pipe 306 includes an arrangement of the sorbent material 322 relative to the electronic component 304 that can transfer heat to more of the second liquid 324 at a faster rate than the heat pipe 206 of FIGS. 5-7. Furthermore, the sorbent material 322 includes a plurality of recesses 352, and the wick material 350 includes a layer 354 extending from the sorbent material 322 to the second end 316 with a plurality of protrusions 358 extending from the layer 354 into the recesses 352 of the sorbent material 322, such that the first liquid 320 can be drawn from the second end 316 to the first end 314 of the tube 308.

Figure 11:
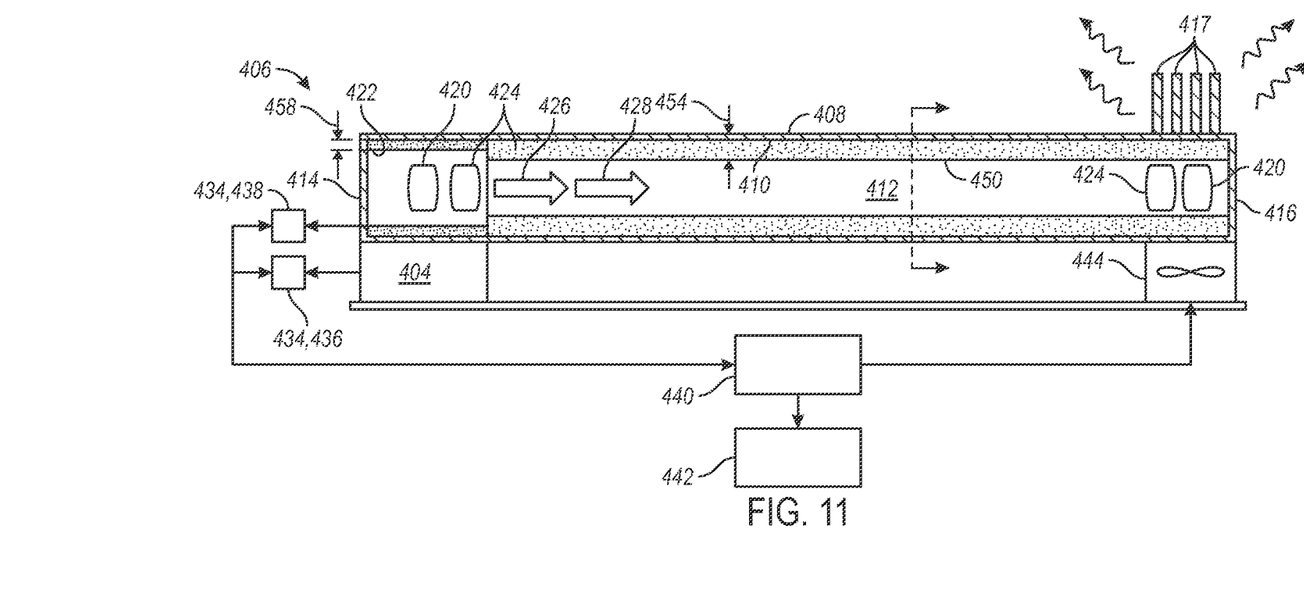
FIG. 11 is a cross-sectional view of still another example of the heat pipe of FIG. 1, illustrating a layer of sorbent material having a thickness that is less than a thickness of a layer of the wick material.

Referring to FIG. 11, another example of a heat pipe 406 is similar to the heat pipe 306 of FIGS. 8-10 and includes the same components identified by the same reference numbers increased by 100. However, while the entire electronic component 304 and only a portion of the sorbent material 322 of FIGS. 8-10 are coextensive with one another, the entire electronic component 404 and the entire sorbent material 422 are coextensive with one another. Furthermore, while the sorbent material 322 and wick material 350 of FIGS. 8-10 form respective layers having thicknesses that are equal with one another, the sorbent material 422 forms a layer 458 having a thickness that is less than the thickness of the layer 454 of wick material 450.

Figure 12:
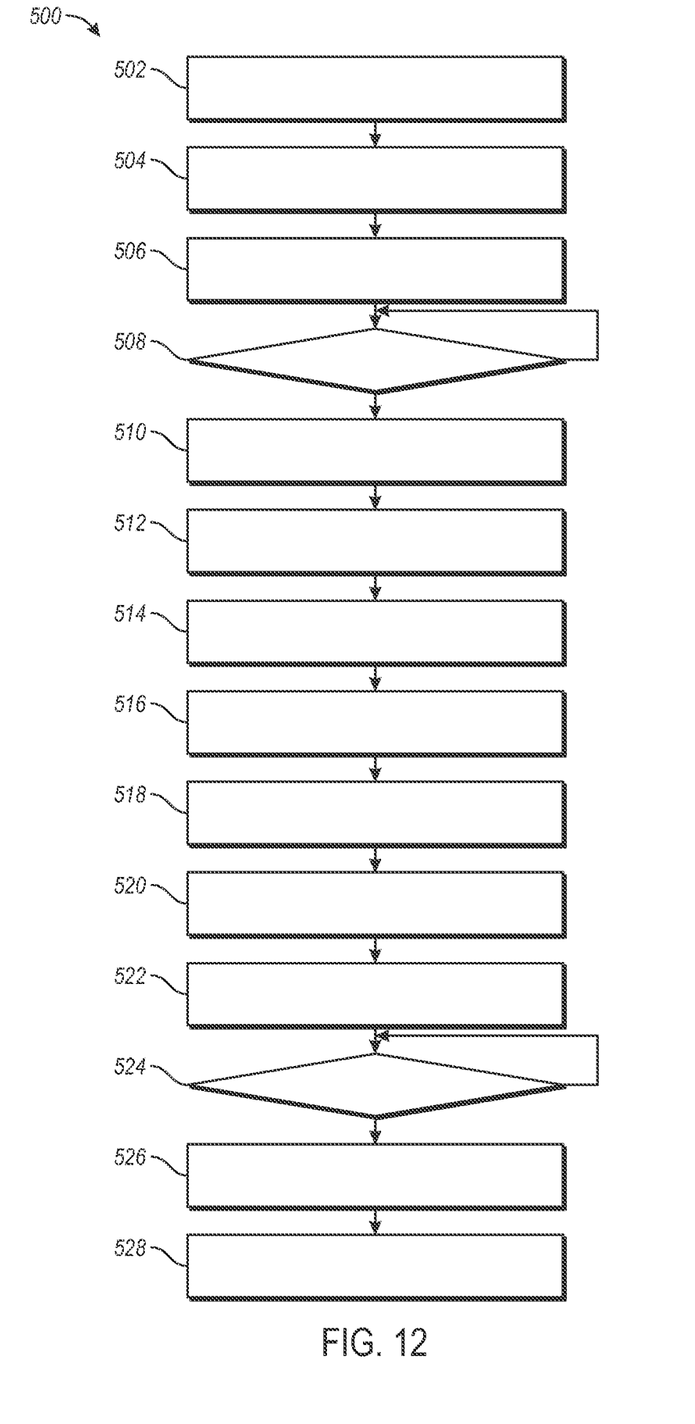
FIG. 12 is a flow chart of one example of a method of operating the printed circuit board of FIG. 2.

Referring to FIG. 12, a method 500 of operating the system 100 of FIG. 2 is provided. The method 500 begins at block 502 with the electronic component 104 transferring heat through the tube 108 to the first liquid 120. The electronic component or other portion of the system can generate heat when the electrical component receives an electric current.

At block 504, the first liquid 120 vaporizes into the first vapor 126, in response to the first liquid 120 receiving heat from the electronic component 104 and the first liquid 120 reaching the first boiling temperature.

At block 506, the first thermocouple 136 generates a first temperature signal associated with a temperature of the first liquid.

At block 508, the controller 140 compares the temperature of the first liquid 120 to a first temperature threshold, in response to the controller receiving the first temperature signal from the first thermocouple 136. In this example, the first temperature threshold is the first boiling temperature. However, it is contemplated that the first temperature threshold can be above or below the first boiling temperature. For instance, to provide additional warning of the first liquid 120 drying out, the first temperature threshold can be a temperature that is less than the first boiling temperature of the first liquid 120. If the temperature of the first liquid 120 is below the first temperature threshold, the method repeats block 508. If the temperature of the first liquid 120 is above the first temperature threshold, the method proceeds to block 510.

At block 510, the controller 140 generates a first warning notification signal, in response to the controller 140 determining that the temperature of the first liquid 120 is above the first temperature threshold.

At block 512, a display device 142 displays a first warning indicative of the first liquid 120 approaching the first temperature threshold, in response to the display device receiving the first warning notification signal from the controller 140.

At block 514, the first vapor 126 flows toward the second end 116 and the fins 117 where the first vapor 126 dissipates heat through the tube 108 and the fins 117.

At block 516, the first vapor 126 condenses into the first liquid 120, in response to the first vapor 126 dissipating heat through the second end 116 of the tube 108.

At block 518, the first liquid 120 is drawn by capillary action from the second end 116 to the first end 114 through the axial grooves 118 formed in the inner diameter surface 110.

At block 520, the second liquid 124 is desorbed from the sorbent material 122 and vaporizes into the second vapor 128, in response to the second liquid 124 reaching the second boiling temperature. In this example, at least a portion of the second liquid 124 is desorbed from the sorbent material 122 into the bore 112 before all of the first liquid 120 vaporizes into the first vapor 126. This can be accomplished by providing liquids of predetermined boiling points, sorbent materials disposed in multiple arrangements relative to the electronic components, and layers of sorbent material having any suitable thickness.

At block 522, the second thermocouple 138 generates a second temperature signal associated with a temperature of the second liquid 124.

At block 524, the controller 140 compares the temperature of the second liquid 124 to a second temperature threshold, in response to the controller 140 receiving the second temperature signal from the second thermocouple 138. In this example, the second temperature threshold is the second boiling temperature. However, it is contemplated that the second temperature threshold can be above or below the second boiling temperature. For instance, to provide additional warning of the second liquid 124 drying out, the second temperature threshold can be less than the second boiling temperature of the second liquid 124. If the temperature of the second liquid 124 is below the second temperature threshold, the method repeats block 524. If the temperature of the second liquid 124 is above the second temperature threshold, the method proceeds to block 526.

At block 526, the controller 140 generates a second warning notification signal, in response to the controller 140 determining that the temperature of the second liquid 124 is above the second temperature threshold.

At block 528, the display device 142 displays a second warning indicative of the temperature of the second liquid approaching the second temperature threshold, in response to the display device receiving the second warning notification signal from the controller 140. In this example, the second temperature threshold is the second boiling temperature. However, it is contemplated that the second temperature threshold can be above or below the second boiling temperature. For instance, to provide additional warning of the second liquid 124 drying out, the second temperature threshold can be a temperature that is less than the second boiling temperature.

The description of the present disclosure is merely exemplary in nature and variations that do not depart from the general sense of the present disclosure are intended to be within the scope of the present disclosure. Such variations are not to be regarded as a departure from the spirit and scope of the present disclosure.

What is claimed is:

1. A heat pipe for an electronics cooling system having an electronic component, the heat pipe comprising:
    a tube having an inner diameter surface defining a bore, with the tube having first and second ends along the bore;
    a sorbent material coated onto the inner diameter surface of the tube;
    a first liquid contained within the bore of the tube and having a first boiling temperature; and a second liquid adsorbed by the sorbent material and having a second boiling temperature that is higher than the first boiling temperature of the first liquid;

wherein the first liquid vaporizes into a first vapor in response to the tube receiving heat from the electronic component and the first liquid reaching the first boiling temperature, and the first vapor moves toward the second end where the first vapor dissipates heat through the tube and condenses into the first liquid;

wherein the second liquid is desorbed from the sorbent material in response to the second liquid and the sorbent material reaching a predetermined desorption temperature that is less than the second boiling temperature, the sorbent material is configured to desorb at least a portion of the second liquid into the bore before all of the first liquid vaporizes into the first vapor, and the second liquid vaporizes into a second vapor in response to the second liquid reaching the second boiling temperature.

2. The heat pipe of claim 1 wherein the inner diameter surface defines at least one axial groove extending between the first and second ends for drawing the first liquid by capillary action from the second end to the first end.

3. The heat pipe of claim 2 wherein the at least one axial groove comprises a plurality of axial grooves spaced circumferentially from one another on the inner diameter surface.

4. The heat pipe of claim 3 wherein the sorbent material is coated onto the inner diameter surface and spaced from the first and second ends of the tube.

5. The heat pipe of claim 4 wherein the first liquid is water.

6. The heat pipe of claim 5 wherein the second liquid is ethylene glycol.

7. An electronics cooling system comprising:
an electronic component generating heat;
a heat pipe for cooling the electronic component, the heat pipe comprising:
  a tube having an inner diameter surface defining a bore, with the tube having first and second ends along the bore;
  a sorbent material coated onto the inner diameter surface of the tube proximal to the first end;
  a first liquid contained within the bore of the tube and having a first boiling temperature; and
  a second liquid adsorbed by the sorbent material and having a second boiling temperature that is higher than the first boiling temperature of the first liquid;
  wherein the first liquid vaporizes into a first vapor in response to the tube receiving heat from the electronic component and the first liquid reaching the first boiling temperature, and the first vapor moves toward the second end where the first vapor dissipates heat through the tube and condenses into the first liquid; and
  wherein the second liquid is desorbed from the sorbent material in response to the second liquid and the sorbent material reaching a predetermined desorption temperature that is less than the second boiling temperature, and the second liquid vaporizes into a second vapor in response to the second liquid reaching the second boiling temperature;
at least one thermocouple attached to at least one of the electronic component and the heat pipe, with the at least one thermocouple generating a first temperature signal associated with a temperature of the first liquid and the at least one thermocouple generating a second temperature signal associated with the temperature of the second liquid;
a controller electrically connected to the at least one thermocouple, with the controller comparing the temperature of the first liquid to a first temperature threshold in response to the controller receiving the first temperature signal from the at least one thermocouple, and the controller generating a first warning notification signal in response to the controller determining that the temperature of the first liquid is above the first temperature threshold;
wherein the controller compares the temperature of the second liquid to a second temperature threshold in response to the controller receiving the second temperature signal from the at least one thermocouple;
wherein the controller is electrically coupled to a display device for displaying a first warning indicative of the first liquid approaching the first temperature threshold in response to the display device receiving the first warning notification signal from the controller; and
the display device displays a second warning indicative of the temperature of the second liquid approaching the second temperature threshold in response to the display device receiving the second warning notification signal from the controller.

8. The electronics cooling system of claim 7 further comprising a fan generating a flow of air for cooling the second end of the tube and the vapor within the closed ended tube.

9. The electronics cooling system of claim 8 further comprising a wick material attached to the inner diameter surface adjacent to the second end of the tube, with the wick material being different from the sorbent material.

10. The electronics cooling system of claim 9 wherein the wick material comprises a layer extending from the second end to a portion of the tube that is adjacent to the electronic component.

11. The electronics cooling system of claim 10 wherein the sorbent material includes a plurality of recesses and the wick material further comprises a plurality of protrusions extending from the layer into the recesses of the sorbent material, such that the wick material draws the first liquid from the second end to the first end of the tube.

12. The electronics cooling system of claim 8 wherein the inner diameter surface defines a plurality of axial grooves extending between the first and second ends for drawing the first liquid by capillary action from the second end to the first end, with the axial grooves being spaced circumferentially from one another on the inner diameter surface.

13. The electronics cooling system of claim 12 wherein the sorbent material is coated onto the inner diameter surface and spaced from the first and second ends of the tube.

14. The electronics cooling system of claim 13 wherein the at least one thermocouple comprises:
a first thermocouple attached to the electronic component and generating the first temperature signal; and
a second thermocouple attached to the heat pipe and generating the second temperature signal.

15. A method of operating an electronics cooling system having an electronic component and a heat pipe attached to the electronic component, with the heat pipe including a tube having first and second ends and having an inner diameter surface defining a bore, a sorbent material coated onto the inner diameter surface, a first liquid having a first boiling temperature and contained within the bore, a second liquid having a second boiling temperature and adsorbed into the sorbent material, at least one thermocouple attached to at least one of the electronic component and the heat pipe, and a controller, the method comprising:
- transferring heat from the electronic component to the first liquid;
- vaporizing the first liquid into a first vapor in response to the first liquid receiving heat from the electronic component and the first liquid reaching the first boiling temperature;
- flowing the first vapor toward the second end where the first vapor dissipates heat through the tube;
- condensing the first vapor into the first liquid, in response to the first vapor dissipating heat through the tube;
- desorbing the second liquid from the sorbent material in response to the second liquid and the sorbent material reaching a predetermined desorption temperature that is less than the second boiling temperature; and
- vaporizing the second liquid into a second vapor in response to the second liquid reaching the second boiling temperature.

16. The method of claim 15 further comprising desorbing, using the sorbent material, at least a portion of the second liquid into the bore before all of the first liquid vaporizes into the first vapor.

17. The method of claim 16 further comprising drawing, using at least one axial groove formed in the inner diameter surface, the first liquid by capillary action from the second end to the first end.

18. The method of claim 17 further comprising:
- generating, using the at least one thermocouple, a first temperature signal associated with a temperature of the first liquid;
- comparing, using the controller, the temperature of the first liquid to a first temperature threshold in response to the controller receiving the first temperature signal from the at least one thermocouple;
- generating, using the controller, a first warning notification signal in response to the controller determining that the temperature of the first liquid is above the first temperature threshold;
- displaying, using a display device, a first warning indicative of the first liquid approaching the first temperature threshold in response to the display device receiving the first warning notification signal from the controller;
- generating, using the at least one thermocouple, a second temperature signal associated with a temperature of the second liquid;
- comparing, using the controller, the temperature of the second liquid to a second temperature threshold in response to the controller receiving the second temperature signal from the at least one thermocouple;
- generating, using the controller, a second warning notification signal in response to the controller determining that the temperature of the second liquid is above the second temperature threshold;
- displaying, using the display device, a second warning indicative of the temperature of the second liquid approaching the second temperature threshold in response to the display device receiving the second warning notification signal from the controller.

* * * * *